United States Patent
Gevaerts et al.

(10) Patent No.: US 11,869,993 B2
(45) Date of Patent: Jan. 9, 2024

(54) METHOD OF MANUFACTURING A THIN FILM PHOTOVOLTAIC PRODUCT

(71) Applicant: Nederlandse Organisatie voor toegepast-natuurwetenschappelijk onderzoek TNO, 's-Gravenhage (NL)

(72) Inventors: Veronique Stephanie Gevaerts, Oisterwijk (NL); Johan Bosman, Wellerlooi (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 0 days.

(21) Appl. No.: 17/624,415

(22) PCT Filed: Jul. 9, 2020

(86) PCT No.: PCT/NL2020/050450
§ 371 (c)(1),
(2) Date: Jan. 3, 2022

(87) PCT Pub. No.: WO2021/006736
PCT Pub. Date: Jan. 14, 2021

(65) Prior Publication Data
US 2022/0359774 A1    Nov. 10, 2022

(30) Foreign Application Priority Data
Jul. 10, 2019   (EP) ..................... 19185484

(51) Int. Cl.
*H01L 31/0463* (2014.01)
*H01L 31/18* (2006.01)
*H01L 31/032* (2006.01)

(52) U.S. Cl.
CPC ...... *H01L 31/0463* (2014.12); *H01L 31/1888* (2013.01); *H01L 31/0322* (2013.01)

(58) Field of Classification Search
CPC ............. H01L 31/0322; H01L 31/0463; H01L 31/0749; H01L 31/1888
See application file for complete search history.

(56) References Cited

U.S. PATENT DOCUMENTS 5,932,118 A     8/1999  Yamamoto et al.
8,048,706 B1 *  11/2011 Ghandour ........... H01L 31/0463
                                                        438/57

(Continued)

FOREIGN PATENT DOCUMENTS

EP    2614525 A2    3/2012

OTHER PUBLICATIONS

European Patent Office, International Search Report in corresponding International Application No. PCT/NL2020/050450, dated Sep. 1, 2020 (2 pages).

(Continued)

*Primary Examiner* — Golam Mowla
(74) *Attorney, Agent, or Firm* — Leydig, Voit & Mayer, Ltd.

(57) ABSTRACT

A method of forming a photovoltaic product with a plurality of photovoltaic cells is disclosed. The method comprises depositing a stack with first and second electrode layers (12, 16) and a photovoltaic layer (14) arranged in between. The method comprises partitioning the stack. The partitioning includes forming a trench (20) extending through the second electrode layer and the photovoltaic layer to expose the first electrode layer. The stack is first irradiated with a laser beam with a first spotsize and with a first wavelength for which the photovoltaic layer has a relatively high absorption coefficient as compared to that of the second electrode layer. The stack is then irradiated with a second laser beam with a second spotsize, greater than the first spotsize, and with a second wavelength for which the photovoltaic layer has a (Continued)

relatively low absorption coefficient as compared to that of the second electrode layer.

16 Claims, 7 Drawing Sheets

(56) References Cited

U.S. PATENT DOCUMENTS

| | | | |
|---|---|---|---|
| 9,960,291 B2* | 5/2018 | Jeong | H01L 31/022425 |
| 2008/0233715 A1* | 9/2008 | Liu | H01L 31/0465 |
| | | | 219/121.68 |
| 2012/0094425 A1 | 4/2012 | Ghandour et al. | |
| 2016/0104807 A1 | 4/2016 | Jeong | |
| 2016/0211395 A1* | 7/2016 | Herrmann | H01L 31/048 |
| 2019/0157480 A1 | 5/2019 | Bosman et al. | |

OTHER PUBLICATIONS

China National Intellectual Property Administration, Office Action in corresponding Chinese Application No. 202080050190.1 dated Oct. 28, 2023.

* cited by examiner

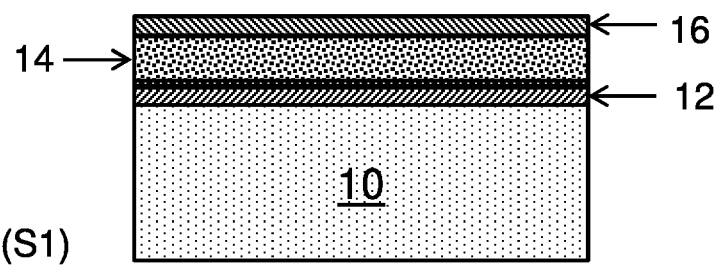
FIG. 2A (S1)
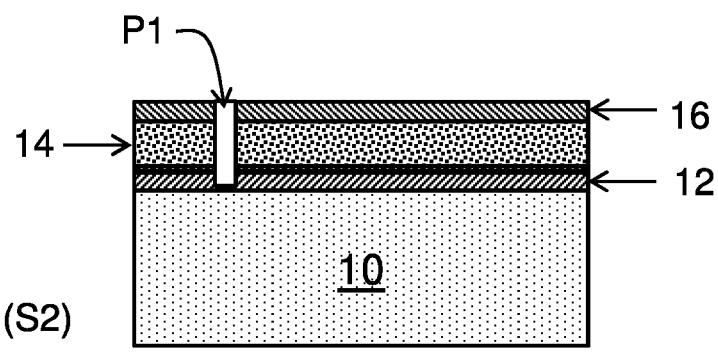
FIG. 2B (S2)
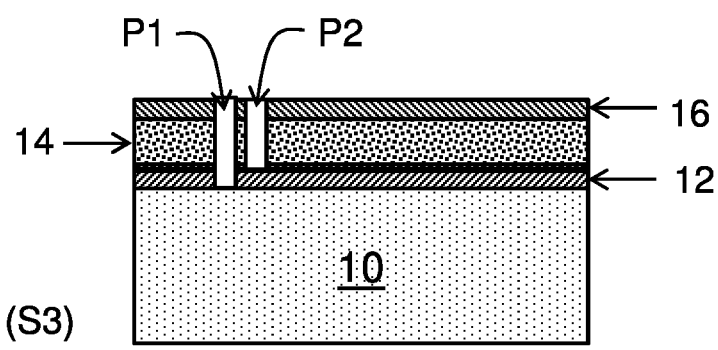
FIG. 2C (S3)

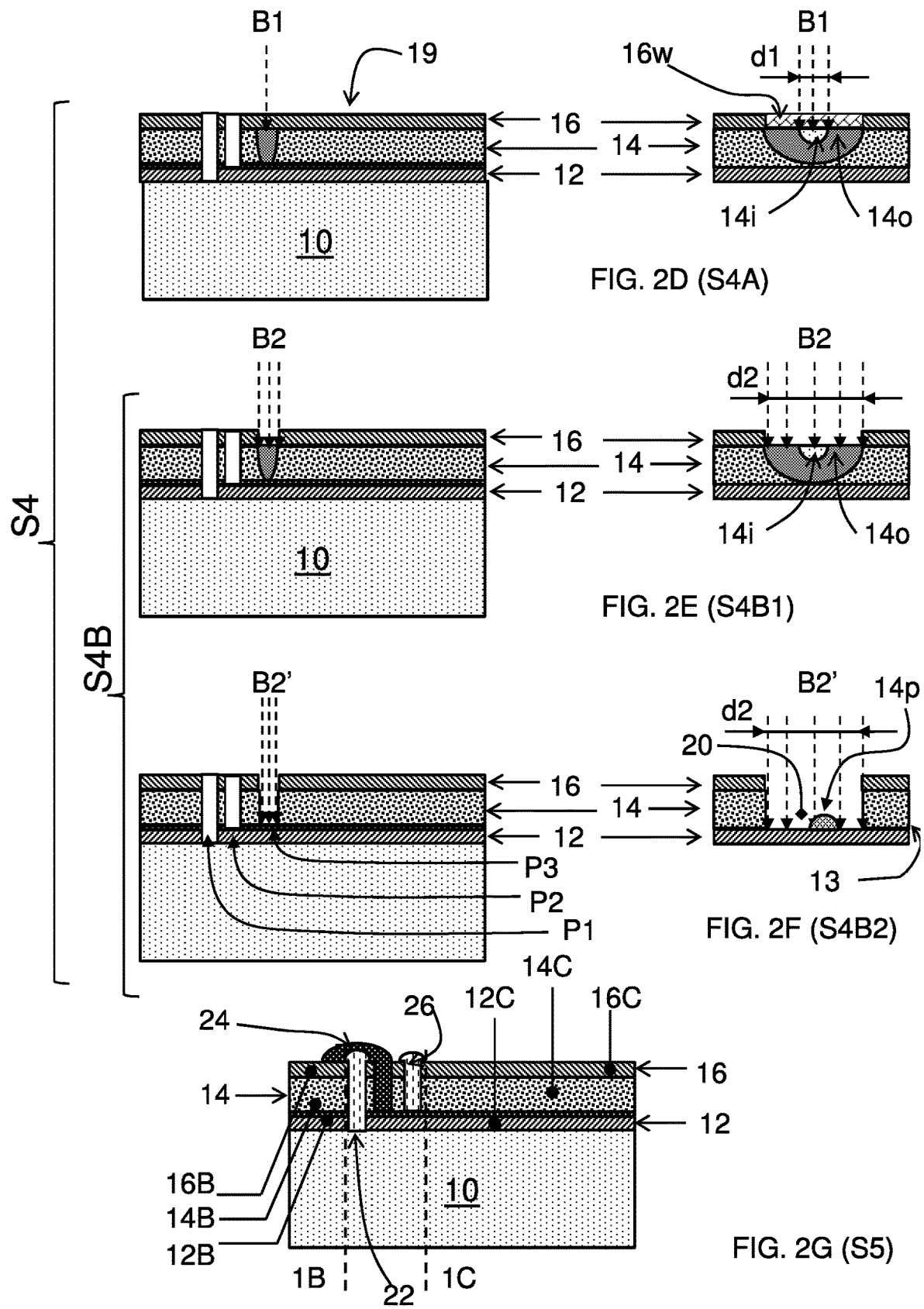

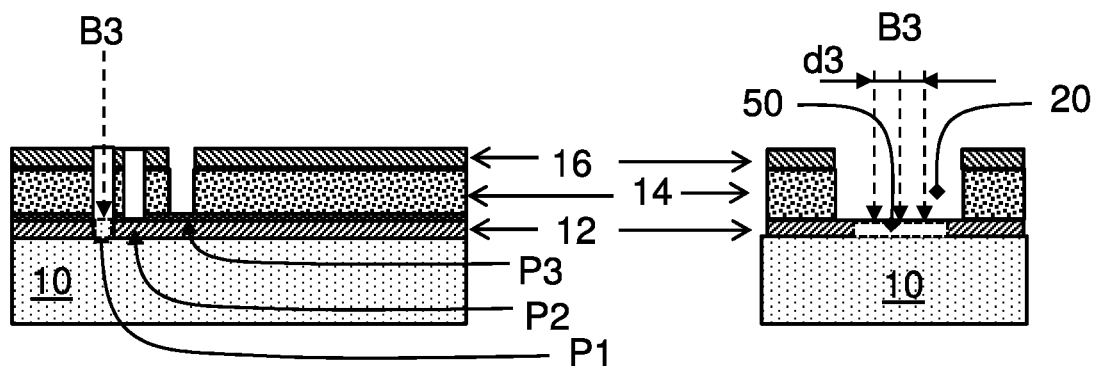
FIG. 2H (S2A)
FIG. 3B
FIG. 3C
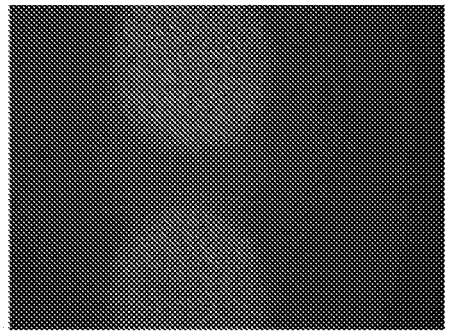
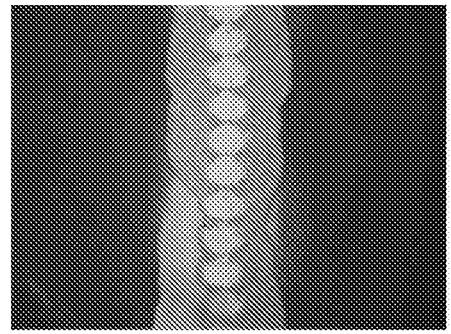
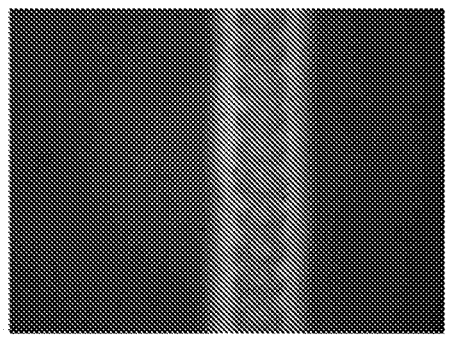
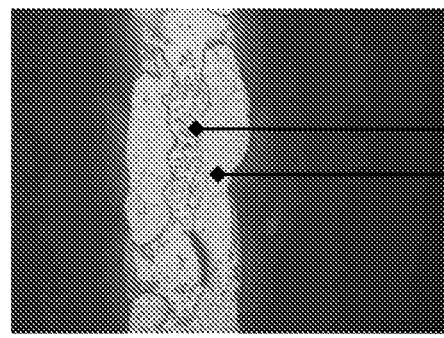
FIG. 3A
FIG. 3D

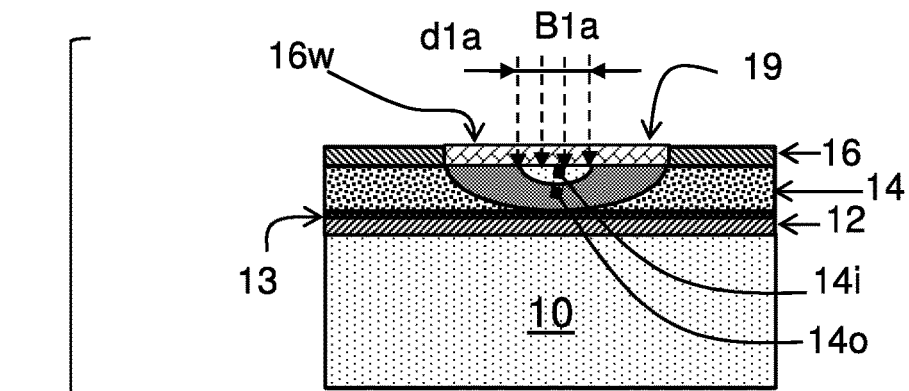
FIG. 4A (S4A)
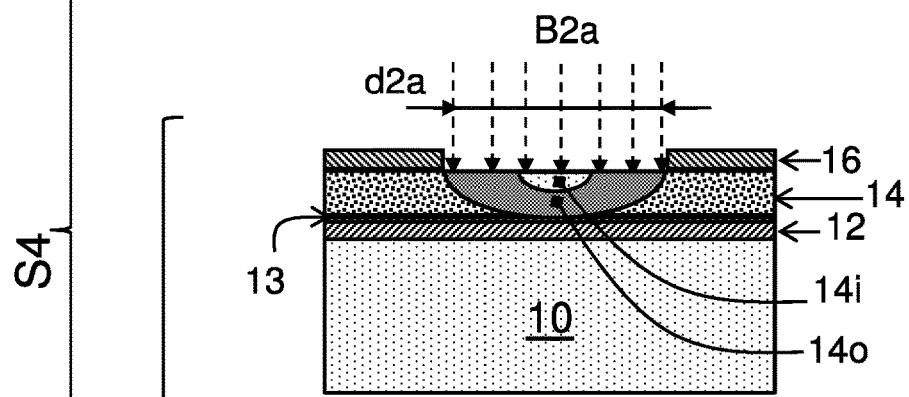
FIG. 4B (S4B1)
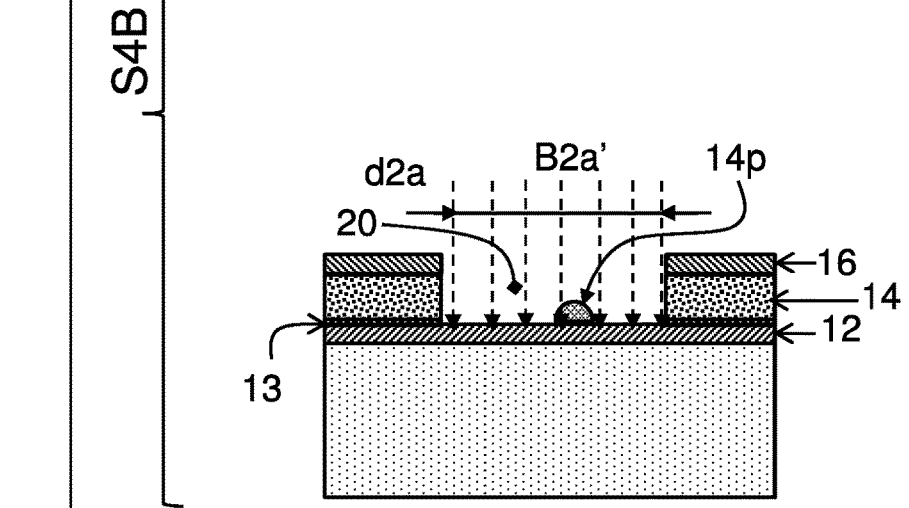
FIG. 4C (S4B2)

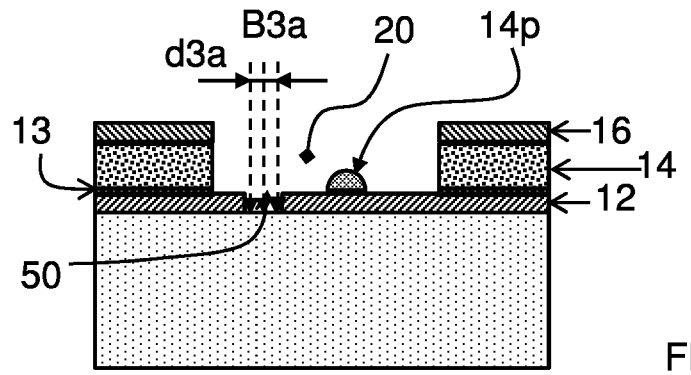
FIG. 4D (S2A)
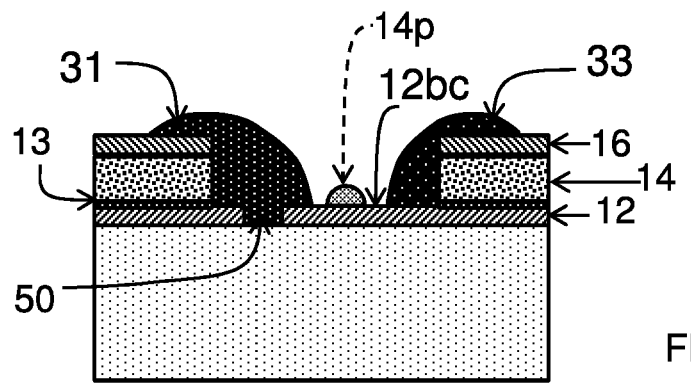
FIG. 4E (S5A)
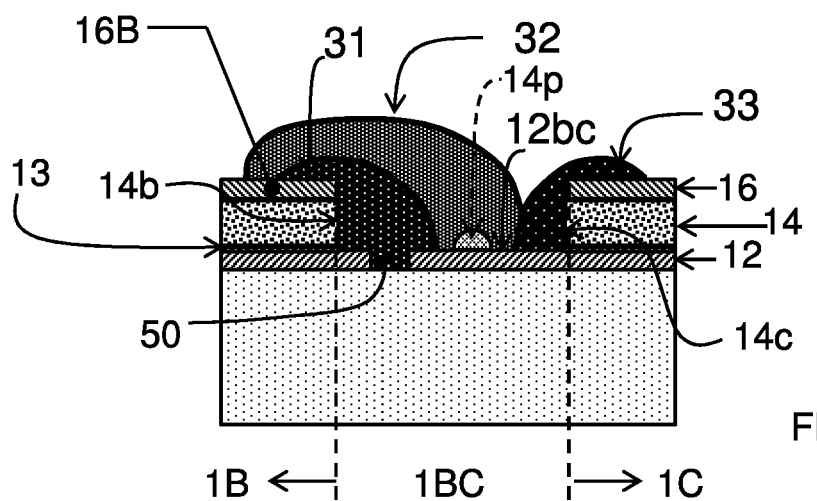
FIG. 4F (S5B)

METHOD OF MANUFACTURING A THIN FILM PHOTOVOLTAIC PRODUCT

CROSS-REFERENCE TO RELATED APPLICATIONS

This patent application is a U.S. National Phase of PCT International Application No. PCT/NL2020/050450, filed Jul. 9, 2020, which claims priority to European Application No. 19185484.3, filed Jul. 10, 2019, which are both expressly incorporated by reference in their entireties, including any references contained therein.

A thin film photovoltaic product typically comprises a stack with a first electrode layer, a photovoltaic layer and a second electrode layer. The stack may be deposited on a substrate, or one of the electrode layers, e.g. the first electrode layer, may serve as the substrate. The stack may include further layers, which are for example arranged between two of these subsequent layers or on top of or below the stack. A layer as referred to herein may comprise sublayers.

Thin film photovoltaic products may be manufactured by subsequent deposition of the abovementioned layers on a substrate, or using for example the first electrode layer as a substrate. Typically the method includes partitioning steps to provide the thin film photovoltaic products with a plurality of photovoltaic cells which are typically monolithically connected in series. In each partitioning step, a trench is formed in one or more layers. The partitioning steps may for example include a first partitioning step P1, a second partitioning step P2 and a third partitioning step P3, wherein first, second and third trenches are formed respectively.

The first trenches are to partition at least the first electrode layer. The second trenches are primarily for partitioning the photovoltaic layer and the third trenches are to partition at least the second electrode layer. The first, second and third trenches alternate each other, so that a boundary between mutually subsequent cells subsequently comprises a first trench, a second trench and a third trench.

Contrary to thin film silicon based photovoltaic materials, other high efficiency photovoltaic materials like CIGS and perovskites have a relatively high lateral conductivity. This necessitates that the partitioning of an electrode also involves the partitioning of the photovoltaic layer, to avoid leakage currents. For an efficient manufacturing process it has been found advantageous to apply all partitioning steps after the deposition of the essential layers, first electrode layer, photovoltaic layer, second electrode layer, of the stack is completed. The first trenches formed in the first partitioning step P1 protrude completely through the stack. The second trenches formed in the second partitioning step P2 as well as the third trenches formed in the third partitioning step P3 protrude until the first electrode layer. It is noted that the trenches can be formed in any order as long as the specified patterning of the stack is achieved after the deposition steps of the stack. Subsequently, each first trench is bridged by an electric connection extending from the first electrode layer of one photovoltaic cell exposed in a neighboring second trench to a second electrode layer of another photovoltaic cell neighboring the one photovoltaic cell at the first trench. For that purpose a electrically conductive paste or ink may be used. Typically the first trench is filled with an insulating material to avoid that an electrically conductive material with which the second trench is to be filled also protrudes in the first trench. As a precaution, lso the third trench may be filled with an insulating material, before depositing the electrically conductive material. Alternatively, this may be avoided in that the electric connection to bridge the first trench is provided as an electrically conductive wire or strip.

According to one approach, a needle is used to mechanically form the trenches in the layer stack. It is a disadvantage of this method that it is relatively inaccurate, and tends to disrupt the stack in the neighborhood of the layer, which requires an over-dimensioning of features in the neighborhood of the trench, such as a distance between the trench to be formed and a neighboring trench. Using a smaller needle enables a more accurate processing, but necessitates frequent maintenance due to wear of the needle.

Alternatively, laser scribing may be used to form the trenches. Approaches are known, wherein the material at the locations of the trenches to be formed is caused to melt and evaporate or to cause a crystal structure phase change by exposure with a laser beam. A substantial amount of energy is required when laser scribing is used to form trenches, which easily tends to damage the photovoltaic material in the neighborhood of the trenches to be formed.

Accordingly, there is a need for an improved method, that allows a more accurate processing causing less collateral damage.

A method of manufacturing photovoltaic cells is known from WO2013026463A1. It describes a scribing process for the removal of selected areas of a thin film from a substrate by means of a laser pulse comprises a step of irradiating with a laser pulse the thin film and the underlying substrate in order to generate a time-varying thermal gradient, wherein the thermal gradient determines a temperature increase not inducing melting or sublimation, while inducing a thermal expansion producing a anisotropic mechanical strain which generates a time-varying detaching force at an interface between the thin film and the substrate capable of contrasting the adhesion force between the thin film and the substrate. Although this known method avoids a melting of the material to be removed, the heat-load to which the semi-finished product is exposed is still high. There is a need to enable a layer partitioning with a lower heat load. In particular a reduced heat exposure of material which is to remain at the boundary of the trenches is desired.

SUMMARY

The laser beam with the first wavelength used in the first irradiation stage is transmitted with low absorption in the second electrode layer to impinge on the surface of the photovoltaic layer. As a result of absorption of this radiation in the photovoltaic layer surface, photovoltaic material locally evaporates from the area of impingement and in the neighborhood thereof melting of the photovoltaic layer occurs. As a result thereof the adhesion of the second electrode layer to the photovoltaic layer is reduced in said neighborhood and the pressure of the vaporized photovoltaic material contributes to detaching the second electrode layer to the photovoltaic layer therein without actually removing the second electrode layer.

In the second irradiation stage, the second electrode layer in said neighborhood is exposed to the radiation with said second wavelength, which is well absorbed by the material of the second electrode layer. Due to the weakened adhesion of the second electrode layer to the photovoltaic layer in said neighborhood only a relatively low power is required for removal of the material of the second electrode layer in that neighborhood and for removal of the therewith exposed photovoltaic material in that neighborhood. Therewith the heat load exerted to the photovoltaic layer is reduced.

The first irradiation stage is performed with a first beam having a relatively narrow spotsize as compared to that of the second beam. Accordingly the photovoltaic material that was affected in the first irradiation stage is at least substantially removed in the second irradiation stage. For a Gaussian beam the spotsize can be considered as √2 times the waist coo of the beam, which is defined as:

$$\omega_0 = 0.5 * Z_R * \Theta_{div}$$

Therein $Z_R$ is the Rayleigh length and $\Theta_{div}$ is the divergence of the beam. For a circular symmetric Gaussian beam, the Rayleigh length is the distance between the position along the optical axis with the minimum wavefront radius to the position along the optical axis with the maximum of the wavefront radius, also denoted as focus point. The waist of the beam is considered the location where the intensity I of the beam is equal to $1/e^2$ the intensity $I_0$ in the center of the beam. In case the beam is not circular symmetric, the spotsize may be defined as √2 times the distance from the center of the beam to the location in a direction transverse to the direction of the trench to be formed where the intensity I of the beam is equal to $1/e^2$ the intensity $I_0$.

In an embodiment, the first spotsize has a value of at least 10 micron. Other embodiments may be contemplated with a value of the first spotsize less than 10 micron. Such embodiments would however require a relatively high pulse repetition rate to achieve a sufficiently high processing speed, e.g. in the order of 2-4 m/s.

The value of the first spotsize typically is not substantially greater than 30 micron. This is based on the consideration that the spotsize of the affected region, where the first irradiation stage causes the photovoltaic material to melt is substantially larger, e.g. 3-10 times larger than the first spotsize. This affected region should not extend beyond the region where the trench is to be formed in the subsequent irradiation stage.

The width of the trench to be formed substantially corresponds to the spotsize of the beam in the second irradiation stage. In practice the second spotsize may be at least 40 micron, to achieve that the trench provides for a sufficiently reliable separation of the relevant device layers. In most cases it is not desired that the value of the second spotsize substantially exceeds 200 micron, as this would affect an unnecessarily large area that would otherwise be available for photovoltaic energy conversion. To that end the first spotsize usually does not need to extend a value above 50 micron, typically does not extend a value above 35 micron. Nevertheless, in some cases, a higher value, e.g. 1000 micron for the second spotsize may be required, for example to enable formation of an interconnection therein. In that case also the value for the first spotsize is typically higher, e.g. in the range of 100-300 micron.

As observed above, the beam in the first irradiation stage affects a relatively wide area as compared to the beam in the second irradiation stage, which results in removal of photovoltaic material in an area that substantially corresponds to the area exposed to that second irradiation stage. This implies the requirement that the second spotsize is larger than the first spotsize. Preferably the second spotsize is substantially larger than the first spotsize, e.g. at least 3 times as large as the first spotsize.

The irradiation stages are performed with substantially monochrome radiation, e.g. within a narrow bandwidth, around the specified wavelength. The first wavelength may for example be in the visible range, e.g. in the range of 400 to 700 nm, e.g. about 532 nm. The second wavelength may be selected in the below bandgap range relevant for the photovoltaic material used. For example in case of a perovskite photovoltaic layer in a tandem photovoltaic cell, the bandgap is 1.2 eV, corresponding to a wavelength of 1033 nm. An example of a perovskite-perovskite tandem photovoltaic cell is described by Epron et al, published online as https://arxiv.org/ftp/arxiv/papers/1608/1608.03920.pdf, ISSN 1095-9203, 20 Oct. 2016. Preferably the second wavelength should be substantially greater than this value defined by the bandgap. For example the photovoltaic material would have a relatively high absorption for radiation with a standard wavelength of 1064 nm, available from a Nd:YAG type laser. Radiation having a wavelength exceeding 1200 nm, such as radiation with a wavelength of 1550 nm is better transmitted. Also selection of a larger value for the second wavelength may be contemplated. In an other example, the solar cell to be manufactured uses CIGS as the photovoltaic material. An example thereof is described in "Improved Energy Conversion Efficiency in Wide Bandgap Cu(In,Ga)Se2 Solar Cells," by Miguel A. Contreras, National Renewable Energy Laboratory, Golden, CO, USA Schott A G, Mainz, Germany, Presented at the 37th IEEE Photovoltaic Specialists Conference (PVSC 37), Seattle, Washington, Jun. 19-24, 2011. A bandgap range of $1.2 < E_g < 1.45$ eV applies for such photovoltaic materials. Accordingly, also in that case the radiation having a wavelength exceeding 1200 nm, such as radiation with a wavelength of 1550 nm may be applicable in the second irradiation stage.

The second stage may be performed in two steps. I.e. a first step wherein material of the second electrode layer is removed from the weakened neighborhood and a second step wherein photovoltaic material is removed from said neighborhood.

The removal of the photovoltaic material in (the second step of) the second irradiation stage may be further promoted by a suitable interface layer between the first electrode layer and the photovoltaic layer. Such an interface layer may be deposited in a separate step, before deposition of the photovoltaic layer, but may alternatively result from a chemical reaction occurring between the first electrode layer and the photovoltaic layer. For example an interface layer of $MoSe_2$ may be formed by a chemical reaction at the boundary of a Mo electrode layer and a CIGS photovoltaic layer.

In an embodiment the second irradiation stage may be performed only after the first irradiation stage is completed for a particular partitioning. In an alternative embodiment the second irradiation stage is performed quasi-simultaneously, for example using a laser unit that scans the surface to be partitioned with a beam pair comprising the first beam and the second beam closely following the first beam.

The method is directly applicable to form a P2-scribe and/or a P3-scribe. The method is further particular suitable to form a P1-scribe. In that case, the step of forming a trench exposing the first electrode layer is succeeded by a further step which comprises a third irradiation stage using a third laser beam with a third spotsize smaller than the second spot size in said transverse direction and with a wavelength for which the first electrode layer has a relatively high absorption as compared to that of a substrate carrying the first electrode layer. Therewith material from the first electrode layer is ablated, and a trench protruding through the first electrode layer is formed.

DESCRIPTION OF THE DRAWINGS

These and other aspects of the disclosure are described in more detail with reference to the drawings. Therein:

FIG. 2A to FIG. 2H schematically show subsequent steps of a method of manufacturing a photovoltaic product according to the present disclosure; Each of FIGS. 2D, 2E, 2F and 2H on its right side shows an enlarged portion of the corresponding cross-section on its left side;

FIG. 3A to 3D shows pictures of samples comprising a photovoltaic layer stack which were exposed to various irradiation treatments.

FIG. 4A-4F show aspects of an alternative embodiment of the method.

DETAILED DESCRIPTION OF EMBODIMENTS

Figure 1A:
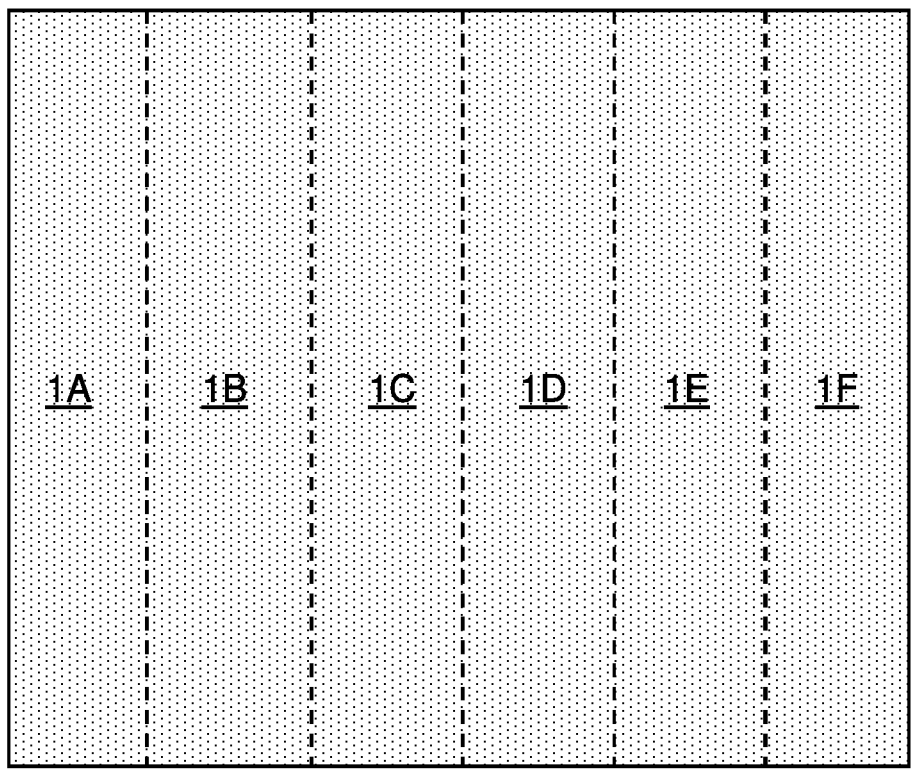
FIG. 1A schematically shows a thin film photovoltaic product with a plurality of serially arranged photovoltaic cells.
Figure 1B:
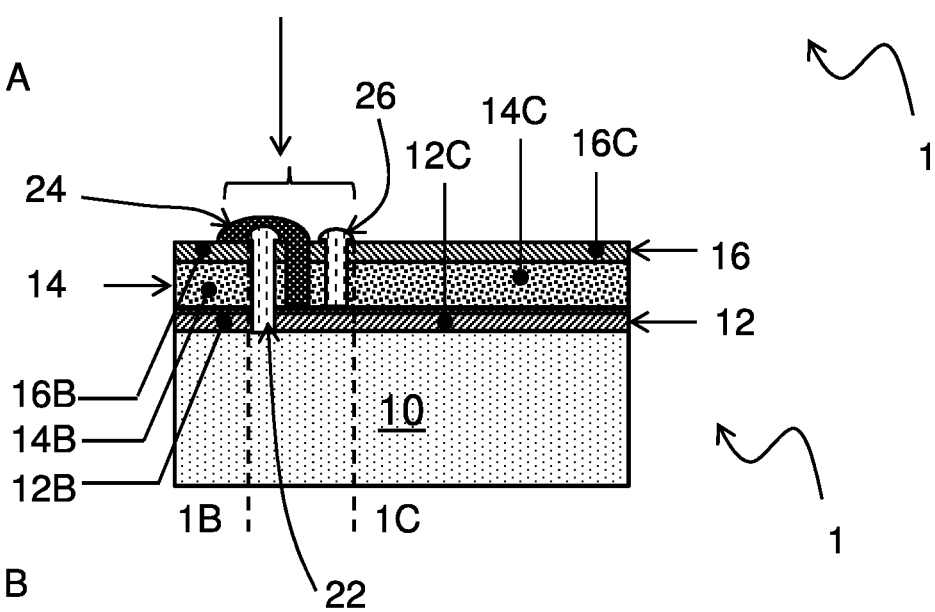
FIG. 1B shows a cross-section at a boundary between a pair of subsequent photovoltaic cells in more detail; Furthermore

FIG. 1A schematically shows a thin film photovoltaic product 1 with a plurality of serially arranged photovoltaic cells 1A, . . . , 1F. A portion of the photovoltaic product 1 at a boundary of mutually subsequent photovoltaic cells 1B, 1C is schematically shown in FIG. 1B. As shown in FIG. 1B, the photovoltaic product 1 comprises a stack with a first electrode layer 12 and a second electrode layer 16 and a photovoltaic layer 14 arranged between said first and said second electrode layer. In some embodiments a layer may comprise two or more sublayers. Furthermore additional layers may be provided on, below or between the layers specifically referred to here. For example, in the embodiment shown, the layers of the stack 12, 14, 16 are present on a substrate 10, it is alternatively conceivable that one of the layers, e.g. the first electrode layer 12 serves as the substrate for the other layers.

Each of the photovoltaic cells comprises a respective portion of the stack of layers. For example photovoltaic cell 1B comprises a first electrode layer portion 12B, a photovoltaic layer portion 14B and a second electrode layer portion 16B. Likewise, photovoltaic cell 1C comprises a first electrode layer portion 12C, a photovoltaic layer portion 14C and a second electrode layer portion 16C. The serial interconnection of the photovoltaic cells 1B, 1C is provided by an electrical connector 24 between the second electrode layer portion 16B of the photovoltaic cell 1B, through the photovoltaic layer 14 to the first electrode layer portion 12C of the photovoltaic cell 1C. The electrical connector 24 extends along the boundary between the photovoltaic cells 1B, 1C. At the side facing the photovoltaic cell 1B the stack 12, 14, 16 is fully interrupted by a trench filled with an insulating material 22. At the side facing the photovoltaic cells 1C only the photovoltaic layer 14 and the second electrode layer 16 are interrupted by a trench filled with an insulating material 26. Alternatively, an empty trench may be present.

Figure 1C:
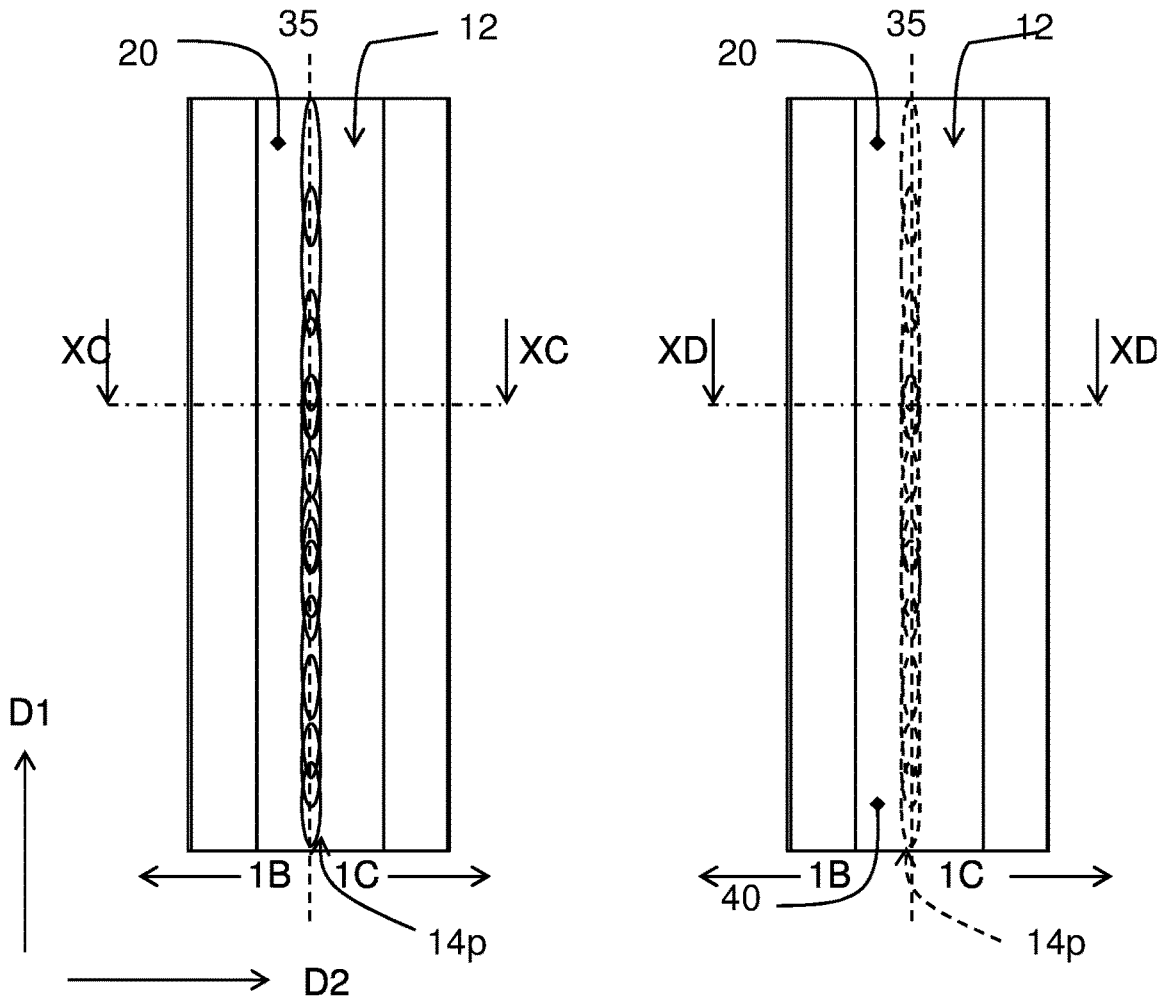
FIGS. 1C and 1D show a detail of respective embodiments of photovoltaic product obtainable with the improved method.
Figure 1D:
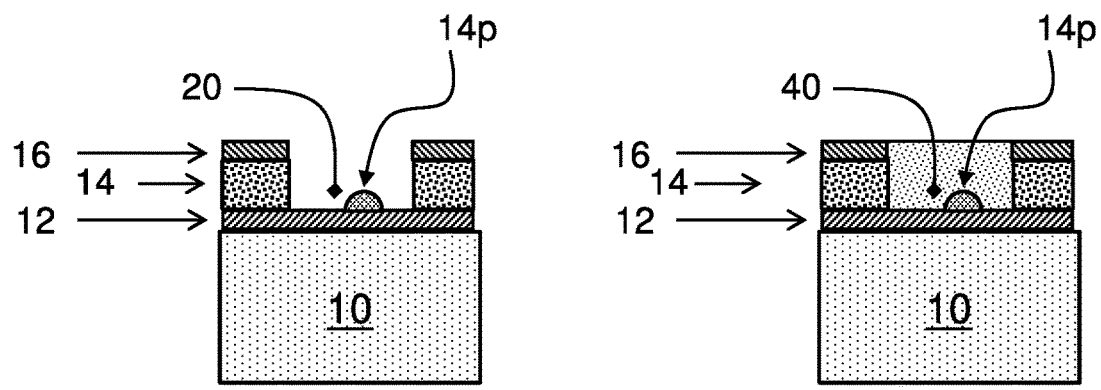

FIGS. 1C and 1D show a detail of respective embodiments of photovoltaic product obtainable with the improved method, as further discussed below.

FIG. 2A-2H schematically show an embodiment of the method of the present disclosure for manufacturing a photovoltaic product 1. Each of FIG. 2D, 2E, 2F, 2H on its right side shows a laterally enlarged portion of the corresponding cross-section on its left side. The steps as shown in FIG. 2A-2H may be implemented batch-wise or in a roll-to-roll process.

FIG. 2A therein schematically shows a deposition stage S1 wherein a first electrode layer 12, a photovoltaic layer 14 and a second electrode layer 16 are deposited on the substrate 10. To allow for a low cost, large scale roll-to-roll production process of solar cells, the substrate 10 may comprise a flexible or pliable foil, which may be transparent in particular embodiments for e.g. two-sided illumination of a solar cell. In an exemplary embodiment the substrate 10 may comprise a thin PET foil, or coated and non-coated metal foils. The first electrode layer 12 may for example be formed of gold, silver, molybdenum copper or a transparent conductive oxide (such as an ITO-layer as the first electrode layer in a perovskite based photovoltaic product). The photovoltaic layer 14 may comprise copper indium (di) selenide, copper indium gallium (di)selenide (CIGS), or perovskites and the second electrode layer 16 may be formed of a transparent conductive oxide (TCO) material such as indium tin oxide (ITO), zinc oxide (ZnO). Additional layers, such as charge transport layers may be provided.

FIG. 2B shows a first partitioning step S2, wherein a trench P1 is formed extending through the first electrode layer 12, the photovoltaic layer 14 and the second electrode layer 16.

FIG. 2C shows a second partitioning step S3, wherein a trench P2 is formed extending through the photovoltaic layer 14 and the second electrode layer 16, therewith exposing the first electrode layer 12 in the trench.

In a subsequent partitioning step S4, a trench P3 is formed extending through the photovoltaic layer 14 and the second electrode layer 16, therewith exposing the first electrode layer 12 in the trench. As set out below, the subsequent partitioning step S4 at least includes a first irradiation stage S4A and a second irradiation stage S4B.

In the first irradiation stage S4A, as schematically shown in FIG. 2D, a free surface 19 of the stack is exposed to a first laser beam B1 with a first spotsize d1 in a direction transverse to the trench 20 (See FIG. 2F) to be formed, and with a first wavelength λ1 for which the photovoltaic layer 14 has a relatively high absorption coefficient as compared to that of the second electrode layer 16. Typically the first wavelength λ1, is in the visible range, as most photovoltaic are intended to operate in this wavelength range. This implies that the second electrode layer 16 is relatively transparent and that the photovoltaic layer is relatively opaque in this wavelength range. Upon exposure to the first laser beam B1, an inner region 14i, of a size substantially corresponding to the spotsize d1 of the first beam, of the photovoltaic material of the photovoltaic layer 14 is evaporated. An outer region 14o of the photovoltaic material of the photovoltaic layer 14 is heat affected and could be partly molten. The pressure of the evaporated photovoltaic material in the inner region 14i partially detaches material of the second electrode layer 16 from the photovoltaic material within the outer region 14o and therewith locally weakens the second electrode layer 16 in a weakened portion 16w facing that outer region. The weakened portion 16w may extend in a direction with which the first laser beam B1 was scanned along the free surface 19.

In this embodiment the second irradiation stage S4B comprises a first irradiation step S4B1 and a second irradiation step S4B2.

In the first step S4B1 of the second irradiation stage S4B, as shown in FIG. 2E, the free surface 19 of the stack is exposed in its weakened portion 16w to a second laser beam B2. The second laser beam has a second spotsize d2 in said transverse direction, which is greater than said first spotsize and substantially corresponds to the size of the weakened portion 16w in the transverse direction. The second laser beam has a second wavelength λ2 for which the second electrode layer 16 has a relatively high absorption coefficient. The weakened and partly detached material in the weakened portion 16w of the second electrode layer 16 is easily detached from the photovoltaic layer 14 in this first step S4B1 of the second irradiation stage S4B.

The second irradiation step S4B2 of the second irradiation stage S4B in this embodiment of the method is shown in FIG. 2F. In step S4B2, the radiation of the beam B2', is substantially transmitted by the photovoltaic layer 14 to the first electrode layer 12. At the surface of the first electrode layer 12 the beam B2 is absorbed by an interface layer 13, which is normally present between the first electrode layer 12 and the photovoltaic layer 14 as reaction product of the materials used for these layers. For example typically an interface layer of $MoSe_2$ is formed between a molybdenum electrode layer and a CIGS photovoltaic layer. Alternatively, an interface layer 13, for example a nickel oxide layer may have been deposited in a separate step. The exposure to the beam B2' causes material of the interface layer 13 to evaporate, therewith locally removing material of the photovoltaic layer 14 to form the trench 20. It may alternatively be contemplated to perform the second irradiation stage S4B in a single step, wherein both material from the photovoltaic layer 14 and from the second electrode layer 16 is removed. As discussed in more detail below, it has been found that in practice minor amounts 14p of material of the photovoltaic layer 14 remain in the bottom of the trench 20 at the surface of the first electrode layer 12.

In order to accelerate the procedure, it may be contemplated to dimension the spot of the first beam with a spotsize in the direction (D1, see FIG. 1C) along the trench to be formed larger than the spotsize measured in the direction (D2) transverse thereto. This requires however an accurate alignment between the spot and the direction of the trench to be formed. Accordingly, preferably the cross-section of the first beam is substantially circular symmetric. The same considerations apply to the second beam. However the beam quality defined in the direction of the trench may be lower than the beam quality defined in the transverse direction.

In subsequent steps S5, illustrated in FIG. 2G, the photovoltaic cells 1B, 1C are serially connected by providing an electric connection 24 between the portion 16B of the second electrode layer 16, through the trench P2 in the photovoltaic layer 14 to the portion 12C of the first electrode layer 12. The electric connection may be provided for example by printing, using a printing compound comprising silver, carbon, copper, aluminum and/or carbon nanotubes. These materials can be deposited by printing techniques, e.g. inkjet printing, screen printing, or other deposition methods such as aerosol printing, dispensing and forward laser transfer. The electrical connection 24 typically extends over the full length of the trench P2 for an optimal conductivity, but this is not necessary. An electrical connection may be alternatively provided at mutually spaced positions along the trench P2. It may also be contemplated to provide the separate openings instead of the trench with an electrical conductive material.

The trenches P1 and P3 may be filled with an electrically insulating material 22, 26 or left free from additional material.

FIG. 3A to 3D shows pictures of samples comprising a photovoltaic layer stack which were exposed to various irradiation treatments. The samples were prepared with a first electrode layer 12 of Mo with a thickness of 400 nm, a copper indium gallium selenide photovoltaic layer 14 having a thickness of 1600 nm, adhered to the first electrode layer by an $MoSe_2$ interface, and a second electrode layer i-ZnO/AZO 16 having a thickness of 400 nm.

FIG. 3A, shows a first one of these samples, which was irradiated with a first pulsed laser beam with a beam power of 0.3+/−0.1 W from a second harmonic laser having a first wavelength of 532 nm and having a spotsize of 20 micron. The repetition rate was 75 kHz with the pulse duration of 1.9 ns. The beam was translated along a scanning trajectory on the surface of the second electrode of the sample at a speed of 1500 mm/s.

FIG. 3B shows a second one of these samples, which was irradiated with a second pulsed laser beam from a Thulium laser. With a power of 6 W, having a second wavelength of 1950 nm and having a spotsize of 80 micron, greater than the first spotsize. The repetition rate was 33 kHz and the pulse duration 30 ns. The beam was translated along a scanning trajectory on the surface of the second electrode of the sample at a speed of 4500 mm/s.

Neither of these processing steps individually result in a removal of material from the sample.

FIG. 3C shows a third one of these samples, which was subsequently irradiated with the first pulsed laser beam B1, as specified for the sample in FIG. 3A and with the second pulsed laser beam B2, as specified for the sample in FIG. 3B. Due to the preparatory first irradiation stage S4A, the adhesion of the second electrode layer 16 to the photovoltaic layer 14 is weakened, Therewith it is rendered possible in the second irradiation stage S4B to locally remove the second electrode layer 16 with a relatively low power, whereas this was not possible without the preparatory first irradiation stage S4A, as was shown in FIG. 3B. Hence the preparatory irradiation stage S4A with the relatively narrow beam B1 renders possible removal of the second electrode layer 16 in an area traversed by the relatively wide second pulsed laser beam B2.

FIG. 3D shows a fourth one of these samples, which was first irradiated with the first pulsed laser beam B1, as specified for the sample in FIG. 3A and then irradiated two times with the second pulsed laser beam B2, B2, as specified for the sample in FIG. 3B. As a result, the second electrode layer 16 as well as the photovoltaic layer 14 were removed in the area traversed by the relatively wide second pulsed laser beam B2, B2 resulting in a trench exposing the first electrode layer. It has been found that in practice minor amounts 14p of material of the photovoltaic layer 14 remain in the bottom of the trench 20 at the surface of the first electrode layer 12. It is conjectured that first irradiation stage S4A causes portions 14p of the photovoltaic material at the surface of the first electrode 12 within the environment of the first pulsed laser beam B1 to melt. Therewith the adhesion of these portions to the first electrode 12 is locally increased. Due to the fact that the trench 20 has a width as determined by the second irradiation stage S4B, that is substantially larger than the width of the first laser beam B1, the trench 20 provides for an efficient sectioning of the layers 14, 16, despite the presence of these photovoltaic material portions 14p.

Reference is made again now to FIGS. 1C and 1D show a detail of respective embodiments of photovoltaic product obtainable with the improved method. Therein the upper portion shows a top view and the lower portion shows a cross-section according to XC-XC and XD-XD respectively. As shown in FIGS. 1C and 1D the photovoltaic product comprises a stack with a first electrode layer 12, a second electrode layer 16 and a photovoltaic layer 14 arranged between said first and said second electrode layer. The stack is partitioned into respective lateral portions 1B, 1C, and an elongate insulating zone 20 extends along a boundary between subsequent photovoltaic cells. The elongate insulating zone 20 partitions the second electrode layer 16 and the photovoltaic layer 14. A re-solidified remainders 14p of photovoltaic material used for the photovoltaic layer 14 are present at a bottom, formed by the first electrode layer 12, and defined by said elongate insulating zone, along a centerline 35 defined by the elongate insulating zone.

FIG. 1C specifically is a detail of first obtainable photovoltaic product, having an elongate insulating zone formed by a gap, i.e. free from solid material.

FIG. 1D is a detail of a second obtainable photovoltaic product. Therein the elongate insulating zone is filled with an insulating material 40 covering the re-solidified remainders 14p of photovoltaic material.

The present invention embodiments have been described above with reference to a number of exemplary embodiments as shown in and described with reference to the drawings. Modifications and alternative implementations of some parts or elements are possible, and are included in the scope of protection as defined in the appended claims. For example, FIG. 2D-2F disclose forming a trench 20 with a dual irradiation, i.e. a first irradiation stage and a second irradiation stage in particular for forming a P3 scribe, i.e. the scribe which defines the boundary of the second electrode layer 16 (and the photovoltaic layer 14). The combination with a first irradiation stage and a second irradiation stage here enables an efficient formation of the trench while minimizing damage to the photovoltaic material at the boundary of the trench. Other approaches may be used to form the P1 and the P2 scribes, e.g. using a mechanical removal step or single step laser ablation procedure. Alternatively, the dual irradiation procedure may also be applied to form these other scribes. For example, the P1 scribe may be formed in a procedure starting with the steps as shown in FIG. 2D-2F to expose the first electrode layer 12, and subsequently, this layer 12 may be partitioned in a final irradiation stage as shown in more detail in FIG. 2H.

In the situation shown in FIG. 2H, it is presumed that the procedure illustrated in FIG. 2D-2F has been used to provide a trench 20 that exposes the first electrode layer 12 at the location where a trench 50 is to be formed that protrudes through the first electrode layer 12. Then in a step S2A as shown in FIG. 2H, a third irradiation stage is applied using a third laser beam B3 with a third spotsize d3 in the transverse direction. The third spotsize d3 should be sufficiently large for a good electrical insulation of the first electrode layer 12 portions, e.g. at least 10 micron. The third spotsize d3 should however be smaller than that of the second spotsize d2, for example half the second spotsize to avoid that a heating by the beam B3 releases additional material from the photovoltaic layer 14 that could cause a shortcut between subsequent first electrode layer portions or between the electrodes 12, 16 at the edges of the trench 20. The third beam B3 has a wavelength for which the first electrode layer 12 has a relatively high absorption as compared to that of a substrate 10 carrying the first electrode layer 12. The wavelength should be sufficiently short to be able to achieve the desired third spotsize d3. The beam may be provided pulse-wise, for example with a pulse duration of at most 100 ns to achieve an effective ablation of the material of the first electrode layer 12 in the trench 20 to be formed.

As shown in FIG. 2H, these steps result in a photovoltaic product wherein the stack comprises a further trench 50 that partitions the first electrode layer 12, wherein the further trench 50 is a continuation of a wider trench 20 that extends to the first electrode layer 12.

The steps shown in FIG. 2D-2F are also applicable to form the P2 scribe. Due to the fact that the remainders 14p of the photovoltaic material 14 are typically well conducting, these do not impede the electrical connection to be formed in the P2 scribe. As a further alternative, a relatively broad trench may be formed with the described dual stage procedure and the P1 scribe may then be formed within this relatively broad trench. Subsequently, the serial connection between neighboring photovoltaic cells, e.g. 1B, 1C can be formed by a proper deposition of electrically insulating and electrically conductive materials. FIG. 4A-4F show aspects of an alternative embodiment of the method. Therein step S4, comprising sub-steps S4A (FIG. 4A), S4B1 (FIG. 4B) and S4B2 (FIG. 4C) correspond to the steps S4A, S4B1 and S4B2, as shown in FIGS. 2D, 2E and 2F respectively. However the first spotsize d1a used of the first laser beam B1a is larger than the first spotsize d1 of the first laser beam B1 in FIG. 2A of the previous embodiment. Likewise the second spotsize d2a used for the second laser beams B2a, B2a' is larger than the second spotsize d2 of the second laser beams B2, B2' in FIG. 2B, 2C of the previous embodiment. Also in this embodiment the second spotsize d2a is larger than the first spotsize d1a, e.g. 3 times larger. By way of example the first spotsize d1 is 300 micron, and the second spotsize d2 is 1000 micron. Therewith it is achieved that a relatively wide trench 20 is formed.

In FIG. 4D, it is shown how the trench 20 is provided with a deepened portion 50, which forms a trench in the first electrode layer 12. The deepened portion 50 extends at distance from the edges of the trench 20, in its length direction and therewith partitions the first electrode layer 12 into mutually insulated parts at each side of the deepened portion 50. Various methods are suitable to form this deepened portion 50, e.g. mechanical removal of the material of the first electrode layer 12 with a needle, laser ablation (e.g. with beam B3a having a spotsize d3) and the like. Due to the fact that the deepened portion 50 is formed at distance from the edges of the trench 20 it can be avoided that therewith the photovoltaic material at the edges is heated to the extent that it melts or that a phase change occurs.

In FIG. 4E it is shown, how in insulating material 31, 32, typically, but not necessarily the same insulating material, is deposited at both sides of the single trench 20. Therewith the material 31 protrudes into the deepened portion 50 of the trench 20 and a strip 12ab of the first electrode layer 12 remains exposed between the deposited insulating material 31, 32.

In FIG. 4F it is shown how an electrical connection 32 is provided by deposition of an electrically conductive material. The electrical connection 32 formed therewith extends from an end portion 16B of the second electrode layer 16 of the photovoltaic cell 1A to the strip 12ab at the end of the first electrode layer 12 of the succeeding photovoltaic cell 1B. It is noted that re-solidified remainders 14p of photovoltaic material (if any) are electrically conductive, and do not impede the electrical connection.

The invention claimed is:

1. A method of manufacturing a photovoltaic product having a plurality of photovoltaic cells, the method comprising:
depositing a stack including:
a first electrode layer,
a second electrode layer, and
a photovoltaic layer arranged between the first and the second electrode layer; and partitioning the stack into respective lateral portions, the partitioning at least including forming a trench extending through the second electrode layer and the photovoltaic layer to expose the first electrode layer,
wherein the forming a trench at least includes a first irradiation stage and a second irradiation stage,
wherein the first irradiation stage comprises using a first laser beam having:
a first spotsize in a direction transverse to the trench to be formed, and
a first wavelength for which the photovoltaic layer has a relatively high absorption coefficient as compared to that of the second electrode layer,
wherein, during the first irradiation stage, the first laser beam impinges on an area of the photovoltaic layer, resulting in:
a local evaporation of photovoltaic material from the area resulting in a vaporized photovoltaic material, and
a melting of photovoltaic material in the neighborhood of the area, the melting resulting further in reducing an adhesion of the second electrode layer to the photovoltaic layer,
wherein a pressure of the vaporized photovoltaic material contributes to detaching the second electrode layer from the photovoltaic layer therein without removing the second electrode layer,
wherein the second irradiation stage comprises removing material of the second electrode layer and of the photovoltaic layer in the neighborhood, using a second laser beam with having:
a second spotsize in the direction transverse to the trench that is greater than the first spotsize, and
a second wavelength for which the photovoltaic layer has a relatively low absorption coefficient as compared to that of the second electrode layer.

2. The method according to claim 1, further comprising serially interconnecting photovoltaic elements.

3. The method according to claim 1, wherein the second irradiation stage comprises a first irradiation and a second irradiation,
wherein, during the first irradiation, material is removed from the second electrode layer to expose a portion of the photovoltaic layer, and
wherein, during the second irradiation, material is removed from the exposed portion of the photovoltaic layer to form the trench extending through the second electrode layer and the photovoltaic layer.

4. The method according to claim 3, wherein during the second irradiation of the second irradiation stage, the second laser beam is substantially transmitted through the photovoltaic layer and absorbed by an interface layer between the first electrode layer and the photovoltaic layer to evaporate material from the interface layer below the exposed portion of the photovoltaic layer and causing expelling of the exposed portion of the photovoltaic layer to form the trench.

5. The method according to claim 1, wherein the second irradiation stage is performed in a single operation, wherein the irradiation by the second laser beam subsequently causes an evaporation of material from the second electrode layer, enabling a transmission of the second laser beam through the photovoltaic layer to be absorbed by an interface layer between the first electrode layer and the photovoltaic layer to evaporate material from the interface layer below the exposed portion of the photovoltaic layer and causing expelling of the exposed portion of the photovoltaic layer to form the trench.

6. The method according to claim 1, wherein the first spotsize is in a range of 10-35 micron, and
wherein the second spotsize is in a range of 40-200 micron.

7. The method according to claim 6, wherein the second spotsize is at least 3 times larger than the first spotsize.

8. The method according to claim 1, wherein the photovoltaic material comprises perovskites.

9. The method according to claim 1, wherein the photovoltaic material comprises CIGS.

10. The method according to claim 1, wherein the forming a trench is succeeded by a further operation that comprises a third irradiation stage using a third laser beam with having:
a third spotsize that is smaller than the second spotsize in the transverse direction, and
a wavelength for which the first electrode layer has a relatively high absorption as compared to that of a substrate carrying the first electrode layer to form a deepened portion within the trench, the deepened portion being a trench protruding through the first electrode layer.

11. The method according to claim 10, wherein subsequent to the further operation, an insulating material is deposited at both sides of the trench,
wherein, at a first side, the insulating material protrudes into the trench and a strip of the first electrode layer remains exposed between the deposited insulating material, and
wherein subsequently an electrical connection is provided by of depositing an electrically conductive material, such that the electrical connection formed therewith extends from an end portion of the second electrode layer of the photovoltaic cell to the strip at the end of the first electrode layer of the succeeding photovoltaic cell.

12. The method according to claim 2, wherein the second irradiation stage comprises a first irradiation and a second irradiation,
wherein, during the first irradiation, material is removed from the second electrode layer to expose a portion of the photovoltaic layer, and
wherein, during the second irradiation, material is removed from the exposed portion of the photovoltaic layer to form the trench extending through the second electrode layer and the photovoltaic layer.

13. The method according to claim 2, wherein the second irradiation stage is performed in a single operation, wherein the irradiation by the second laser beam subsequently causes an evaporation of material from the second electrode layer, enabling a transmission of the second laser beam through the photovoltaic layer to be absorbed by an interface layer between the first electrode layer and the photovoltaic layer to evaporate material from the interface layer below the exposed portion of the photovoltaic layer and causing expelling of the exposed portion of the photovoltaic layer to form the trench.

14. The method according to claim 2, wherein the first spotsize is in a range of 10-35 micron, and the second spotsize is in a range of 40-200 micron.

15. The method according to claim 3, wherein the forming a trench is succeeded by a further operation that comprises a third irradiation stage using a third laser beam having:
a third spotsize that is smaller than the second spotsize in the transverse direction, and
a wavelength for which the first electrode layer has a relatively high absorption as compared to that of a substrate carrying the first electrode layer to form a deepened portion within the trench, the deepened portion being a trench protruding through the first electrode layer.

16. The method according to claim 2, wherein the photovoltaic material comprises perovskites and/or copper indium gallium (di)selenide (CIGS).

* * * * *